United States Patent [19]

Lerche et al.

[11] Patent Number: 4,495,413

[45] Date of Patent: Jan. 22, 1985

[54] PROCESS FOR CALIBRATING ION-CURRENT AMPLIFIERS IN MASS SPECTROMETERS AND MASS SPECTROMETER FOR CARRYING OUT THE PROCESS

[75] Inventors: Heinz Lerche, Bremen; Horst Rache, Delmenhorst; Reiner Wedde, Seebergen, all of Fed. Rep. of Germany

[73] Assignee: Finnigan Mat GmbH, Fed. Rep. of Germany

[21] Appl. No.: 425,314

[22] Filed: Sep. 25, 1982

[30] Foreign Application Priority Data

Oct. 8, 1981 [DE] Fed. Rep. of Germany ....... 3139975

[51] Int. Cl.$^3$ ................ G01D 18/00; G12B 13/00; B01D 59/44
[52] U.S. Cl. .......................... 250/252.1; 250/281; 250/282
[58] Field of Search .............. 250/252.1, 281, 282, 250/283

[56] References Cited

U.S. PATENT DOCUMENTS

| | | | |
|---|---|---|---|
| 3,486,113 | 12/1969 | Foster | 250/252.1 |
| 3,920,986 | 11/1975 | Fies | 250/282 |
| 3,922,541 | 11/1975 | Seeman | 250/252.1 |
| 4,164,652 | 8/1979 | Wollnik | 250/282 |

OTHER PUBLICATIONS

"A Five-Collector System for the Simultaneous Measurement of Argon Isotope Ratios in a Static Mass Spectrometer", Stacy et al., *Int. Journ. of Mass Spectrometry and Ion Physics*, 39, (1981), pp. 167-180.

*Primary Examiner*—Bruce C. Anderson
*Attorney, Agent, or Firm*—Flehr, Hohbach, Test, Albritton & Herbert

[57] ABSTRACT

For calibrating mass spectrometers with a plurality of ion targets (1), especially Faraday targets, to which a separate measuring channel is assigned in each case, an electric current from a highly stable electrical voltage-source (6) is supplied, as a measurement reference-value, to the individual measuring channels, in chronological succession, via a resistor ($R_2$) having a high degree of constancy. For this purpose, a control device (7) is provided, which actuates switching devices ($K_1$-$K_n$) in such a manner that the correct chronological sequence is maintained. The calibrating measurement-values, obtained with the aid of this highly stable current, are intercorrelated in order to form a correction-value, this correlating operation being performed in a calibrating-correction unit (5). Several calibrating measurements, with different currents, can be carried out for each measuring channel ($V_1$-$V_m$), and these measurements can also be carried out with the aid of an external, linearly controllable voltage-source, which produces these currents via the resistor ($R_2$) having a high degree of constancy.

11 Claims, 1 Drawing Figure

U.S. Patent   Jan. 22, 1985   4,495,413
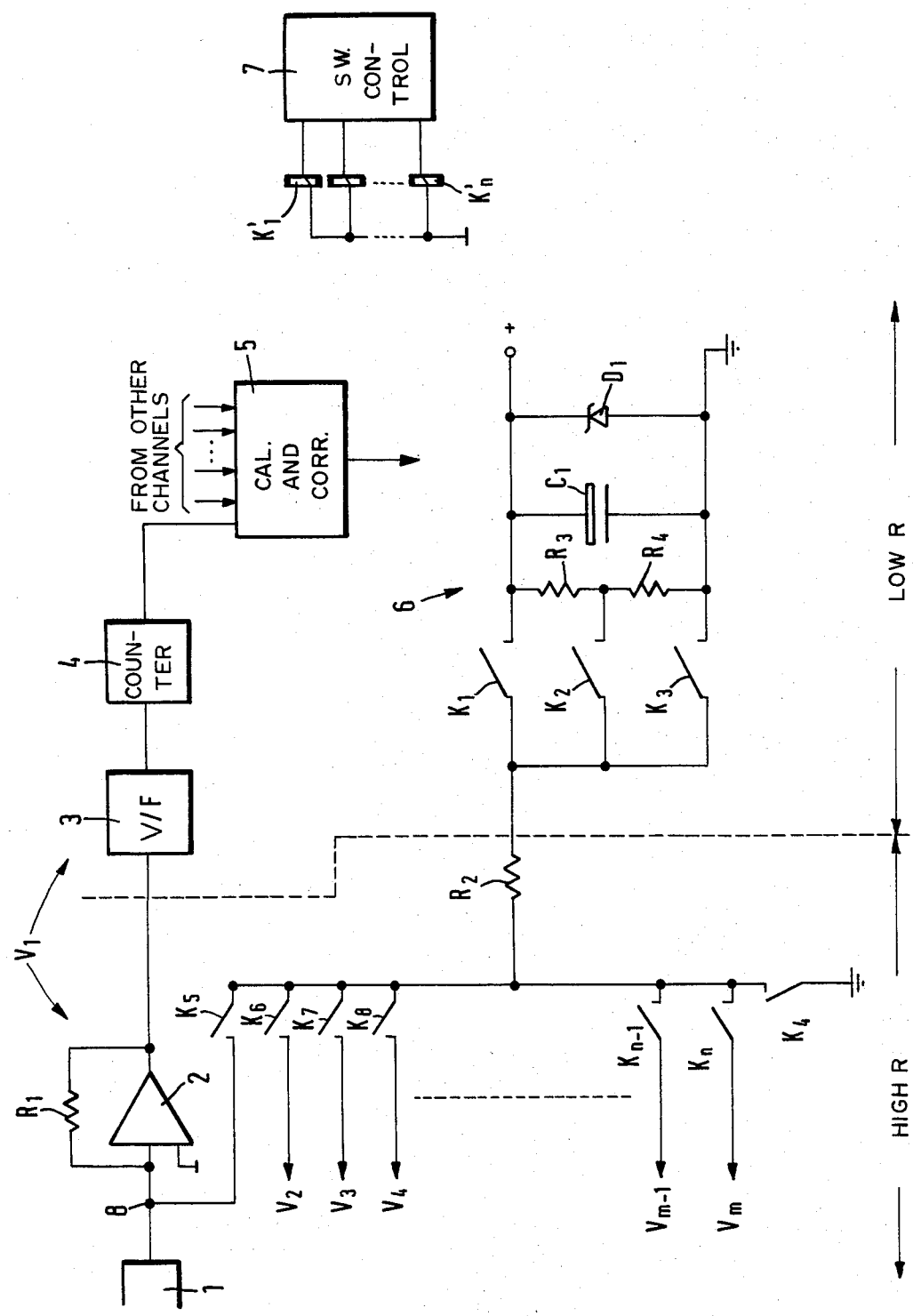

PROCESS FOR CALIBRATING ION-CURRENT AMPLIFIERS IN MASS SPECTROMETERS AND MASS SPECTROMETER FOR CARRYING OUT THE PROCESS

DESCRIPTION

The invention generally relates to the field of mass spectrometers with a plurality of ion-targets.

Mass spectrometers with a plurality of targets, or collectors, are generally known and are described, for example, in the periodical "International Journal of Mass Spectrometry and Ion Physics," Vol. 39 (1981), pages 167–180". So-called "Faraday targets" or "Faraday pots" are preferably used as targets, which are generally known in the field to which the present text refers. Mass spectrometers of the type in which the individual targets simultaneously receive ion-beams, have a markedly higher performance and are faster than mass spectrometers with only one target. A separate measuring channel is assigned to each target, this measuring channel invariably containing an amplifier, as well as, if appropriate, further signal-conditioning or signal-conversion devices, the individual channels being in that case, connected to a common evaluating unit. However, one problem in mass spectrometers of this type resides in the fact that the individual measuring channels cannot, in practice, be exactly identical, due, for example, to scatter-effects in the individual components, different amounts of heating, etc.

The fact that the measuring channels cannot be identical then causes the measurement results to be different for each channel, thus falsifying the analysis result.

In order, in the case of mass spectrometers with multiple targets, to avoid the measuring inaccuracies described above, it is known, from the abovementioned literature reference (in particular page 178), to work with a "calibrating substance". According to this procedure, measurements are carried out on the individual measuring channels, with a known reference-value. The individual ion-beam signals are then compared with one another, from which it is possible, by intercorrelating the individual measurement-values, to form a correction-value.

Since, as mentioned, the measurement-values of this calibrating substance are known, the result of the measurement enables conclusions to be drawn with regard to the characteristics of the individual measuring channels.

However, a calibration process of this type, for a plurality of targets, is comparatively expensive, because a suitable known "calibrating substance" has to be fed through the mass spectrometer. Moreover, the calibration accuracies hitherto obtained in practice are not adequate.

When two or more ion-targets are used, two different errors do, in fact, arise:
(a) disturbance of the ion-currents in the ion-path and in the Faraday target, and
(b) disturbance of the ion-currents resulting both from the high ohmic resistance of the amplifier of the series-connected measuring channel, and from its offset-currents.

When the calibration process is carried out with a constant ion-current ("calibrating substance"), only the sum of the two above mentioned disturbances can be determined. At the same time, it is impossible to exclude the possibility that the two disturbances are compensating one another, and are thus producing the illusion that disturbance-free operation is occurring. As soon as the arrangement is altered, for example, as a result of unavoidable slight shifts in the path of the ion beam, occurring during the measurement, the compensation which may have been present during the calibration process is no longer valid. It is accordingly necessary to evaluate the two above-mentioned disturbances separately.

The first-mentioned disturbance of the ion-currents, which leads, in the end, to instability in the "ion-signal", can be explained by the fact that, in a mass spectrometer, the ion-current is generated by individual ions, which arrive at the target in chronological succession. The time-difference between two ion-impacts is not constant, but is subject to scatter in accordance with the laws of probability, so that a system-intrinsic error thereby occurs, irrespective of the type of measuring channel used (compare H. Kienitz, "Massenspektrometrie [Mass Spectrometry]", Verlag Chemie GmbH, 1968).

For this reason, mass spectrometers with a plurality of targets, although capable of high-speed operation, are nevertheless less accurate, up to the present, than single-target designs.

The object of the invention is accordingly to provide a process for calibrating ion-current amplifiers in mass spectrometers with a plurality of ion-targets, as well as to provide a mass spectrometer for carrying out this process, which, in combination, enable rapid and accurate calibration to be carried out.

This object is achieved when an electric current having a high degree of constancy is supplied, as a reference-value to the individual measuring channels, in chronological succession. It is therefore no longer necessary to work with a "calibrating substance". In contrast, an electric current having a high degree of constancy is used as a reference-value, in place of the ion-current generated by the calibrating substance.

In the case of the invention, the electrical channels are consequently separated, and are calibrated independently of one another. From the above-mentioned sum-effect, which is measured by the ion-currents, and from the result of the calibration of the individual channels, it is possible, by subtraction, to deduce the ion-optical component of the error. In contrast to the known process, in which only the ion-currents are measured, it is consequently possible to obtain results of markedly improved reliability, because individual error-effects can be evaluated separately.

An apparatus for carrying out the process, that is to say, a mass spectrometer according to the invention, contains a highly stable electrical voltage-source, the output of which can be connected, via switching devices, in each case to a common connection-point of the individual ion-targets and of the measuring channels assigned thereto, a control unit being provided, which chronologically controls the switching devices in such a manner that the voltage-source is successively connected to the individual measuring channels, via the resistor having a high degree of constancy, the outputs of all the measuring channels being connected to a common calibrating-correction unit, which contains memory for the output measurement-values from all the measuring channels, as well as a processor, which uses the stored values in order to form a correction factor.

In order to eliminate the influence of a so-called "offset error" in the measuring channels and, in particular, in the amplifiers, two different measurements are carried out with each measuring channel. In detail, two electrical currents having a high degree of constancy, but differing from each other, are supplied to each measuring channel, in chronological succession, the measurement-values resulting from this procedure being subtracted, one from the other, and stored. This operation is repeated, in the same manner, for all the other measuring channels. Since the offset error is independent of the input quantity, it is eliminated by these steps.

In the mass spectrometer carrying out these steps, the highly stable voltage-source can be switched over, by means of the control unit, to at least two different voltage-values, it being possible to supply the currents generated from these voltages to each measuring channel in chronological succession via the resistor having a high degree of constancy, and the output values, obtained from this procedure, being supplied to the memory, which is connected, on its output side, to a subtractor, in such a manner that the output measurement-values of each measuring channel are subtracted, one from the other.

In a particularly simple embodiment of this concept, one of the electrical voltages, having a high degree of constancy, from the highly stable electrical-source, has the value of zero. In the case of one circuit-engineering design, a switching device is provided, for this purpose, which connects the output terminal of the highly stable voltage-source to various tappings of the voltage-source, including, among others, to a tapping at zero potential (earth).

Since, during the calibrating operation, very small electric currents flow, these currents being of the order of magnitude of $10^{-11}$A it is necessary to ensure that static charging effects are also prevented from occurring during the individual switching-over operations. For this purpose, it is arranged, according to the invention, that one output terminal of the source providing the voltage, or voltages, having a high degree of constancy is earthed during the operation of switching over to another measuring channel, and/or during the operation of switching between the two electrical voltages having a high degree of constancy.

In this context, an additional switching device is provided, in one circuit-engineering design, which connects the switching devices, connecting the measuring channels to the voltage-source, to that side of the voltage-source which is at zero potential. Arrangements are made, furthermore, whereby the additional switching device can be actuated, by the control device, in such a manner that it is closed while one of the switching devices is being actuated. This means that, during each switching-over operation, the output terminal of the voltage-source is earthed, so that static charges, and the errors which they cause, cannot occur.

In the case of a preferred circuit-engineering design, all the switching devices are formed by relays. Relays which are suitable in this context possess switching contacts in an inert-gas atmosphere, so that a very low and precisely defined contact resistance occurs and the highest possible isolation resistance is ensured when the contact is open.

In the text which follows, the invention is described by reference to an illustrative embodiment, in conjunction with the drawing.

For the purposes of this description, the single FIGURE shows a schematic block circuit diagram of the output-side section of a mass spectrometer. Only one measuring channel $V_1$ is represented in the FIGURE, while the remaining measuring channels, which are constructed identically, are indicated only by the reference numbers $V_2$-$V_m$. Each measuring channel contains a target 1, which is connected to an input terminal of an amplifier 2. The amplifier 2 is wired for negative feedback via a high-resistance negative-feedback resistor $R_1$. The output terminal of the amplifier 2 is connected to a voltage/frequency converter 3, the output terminal of this converter being connected to a counter 4. The output terminals of all the counters 4, belonging to the measuring channels $V_1$-$V_m$, are connected to the corresponding input terminals of a calibrating-correction unit 5.

A highly stable electrical voltage-source 6 and an electrical resistor $R_2$ are provided for generating a reference current for the calibration, this resistor $R_2$ having a high degree of constancy and being connected to the output terminal of the voltage-source 6. In the illustrative embodiment shown, the voltage-source 6 is constructed as follows. A Zener-diode $D_1$ is connected between a positive supply voltage (+) and earth potential, and an electrolytic capacitor $C_1$ is connected in parallel to this diode. In addition, a series-connected arrangement, comprising two resistors $R_3$ and $R_4$ is connected in parallel to the diode $D_1$ and the capacitor $C_1$. The individual connections of the resistors $R_3$ and $R_4$ can be connected to the resistor $R_2$, via switching devices $K_1$, $K_2$ and $K_3$ respectively. The electric currents having a high degree of constancy, which are used for the calibration, are generated, as calibrating currents, by means of this electrical resistor $R_2$, which has a high degree of constancy, and from the voltage which is applied to this resistor by the highly stable electrical voltage-source 6.

In detail, the switching device $K_1$ connects the positive pole of the voltage-source 6 to the resistor $R_2$, while the switching device $K_2$ connects the central tapping, or common connection-point of the resistors $R_3$ and $R_4$ to the resistor $R_2$. Finally, the switching device $K_3$ connects the earth potential of the voltage-source 6 to the resistor $R_2$.

The resistor $R_2$ preferably has the same value as the individual negative-feedback resistors $R_1$ of the measuring channels in question. The other lead from the resistor $R_2$ is connected to a bus line common to the switching devices $K_5$-$K_n$. The other lead from each of these switching devices $K_5$-$K_n$ is, in each case, connected to a common connection-point 8 between the target 1 and the amplifier 2 of the individual channel. The switching device $K_5$ is thus connected to the measuring channel $V_1$, the switching device $K_6$ is connected to the measuring channel $V_2$, etc., until the switching device $K_n$ is connected to the measuring channel $V_m$. At the same time, the amplifiers 2 are, in functional terms, current-/voltage converters, which form voltage signals corresponding to the (calibrating) currents which are applied to them, these voltage signals then being processed by the series-connected voltage/frequency converter 3.

The bus line common to the switching devices $K_5$-$K_n$ can be connected to earth potential via an additional switching device $K_4$.

The switching devices $K_1$-$K_n$ are represented as relay switches, the excitation coils $K'_1$-$K'_n$ respectively assigned to each relay, being operable by means of a control device 7.

In the FIGURE, a broken line separates a high-resistance zone from a low-resistance zone.

The control device 7 actuates the individual switching devices, or relays, as follows:

It should first be assumed that the intention is to perform measurements on the measuring channel $V_1$, and to calibrate it. For this purpose, the switching devices (termed "switches" in the text which follows) $K_3$ and $K_4$ are initially in the closed position, while all the other switches are open. The switch $K_5$ is thereupon closed, and the switch $K_4$ is then opened. The common connection-point 8 and, therefore, the input terminal of the amplifier 2 are consequently at earth potential. Consequently, only the offset voltage is present at the output terminal of the amplifier 2. In the voltage/frequency converter 3, this voltage is converted into a proportional frequency, and pulses, at this frequency, are counted in the counter 4. On expiry of a predetermined period, the reading of the counter 4 is transferred into the calibrating-correction unit 5, where it is stored. Immediately thereafter, the switch $K_3$ is opened, and the switch $K_1$ (or $K_2$, according to choice) is closed. Approximately the maximum current then flows in the amplifier. The output voltage of the amplifier 2 is then measured, in the same way, and the result is stored in the calibrating-correction unit 5. These two values, stored for the measuring channel $V_1$, are then subtracted, one from the other, in the calibrating-correction unit 5, from which operation, if the voltage of the voltage-source 6 is known, the amplification factor for the measuring channel $V_1$ is obtained.

The switch $K_1$ is now opened, and the switch $K_3$ is closed again. Zero potential is consequently again present at the measuring channel $V_1$. The switch $K_5$ is then opened, and the switch $K_6$, for the second measuring channel $V_2$, is closed. The procedure is now continued, in an analogous manner, for the measuring channels $V_2$ to $V_m$.

After completion of the calibrating measurements, the switch $K_4$ is closed again. The difference-values, stored for the individual channels, are thereupon inter-correlated in the calibrating-correction unit 5.

In detail, one of the channels, for example the measurement channel $V_1$, is selected as a reference channel, the difference-value of the two measurements, which value has been stored for this channel and corresponds to the amplification factor, is divided, in each case, by the stored amplification factor for each of the other channels. This quotient then represents a correction-factor for the corresponding channel, the measurement-values, obtained from this channel, being multiplied by this factor.

This method eliminates the effects of different amplification factors for the individual channels.

Different offset errors in the individual channels can be taken into account by suitable subtraction operations, but this is unnecessary in the case of the present application, since only the relative measurement-results from the individual channels are of interest when operating the mass spectrometer, and not the absolute values of these results.

In the case of the calibrating operation described above, the tacit assumption has been made that the individual measuring channels and, in particular, their amplifiers, operate linearly, so that a single correction-factor suffices over the entire measurement range. Since this is not always the case, the highly stable voltage-source 6 is arranged to possess several steps, which may be of any desired number, for the purpose of increasing the measuring accuracy, as indicated by the switch $K_2$. Still more steps could, of course, also be provided here, a series-connected arrangement, comprising a plurality of resistors, being inserted in place of the resistors $R_3$ and $R_4$, an additional switch being connected, in each case, at the connection-points within this plurality of resistors.

Furthermore, in place of a stepped arrangement, an externally controllable voltage-source can also be connected, this voltage-source being connected, in the illustrative embodiment shown in the FIGURE, to the common connection-point of the switches $K_1$–$K_3$. A voltage-source 6 of this type enables the entire measuring range, of all the measuring channels, to be traversed, in a linear manner, from which a correction-factor is obtained, which is a function of the input voltage from the particular measuring channels in question, and which is thereafter applied during the actual measurement. The calibrating-correction unit 5 is then, of course, of more complex construction, the memory devices, in particular, being capable of storing very many more values than in the case of the procedure which has been described above.

During the actual measurement, that is to say, after calibration, the switch $K_4$ is always closed, so that electrostatic charges are led away to earth.

Furthermore, it is ensured, during both calibration and measurement, that all boundary conditions remain constant. The region occupied by the targets, and the highly stable electrical voltage-source are maintained at a constant temperature, for example, between 35° and 45° C., this being effected by means of suitable thermostats. It is also advantageous to house the components shown in the FIGURE in an evacuated enclosure, so that all relevant boundary conditions at the targets and/or the measuring channels remain constant, as a result of which re-calibration is necessary only from time to time.

The electric currents which flow during the calibrating process lie within the pA-range, and consequently vary within the order of magnitude of the ion-currents which are subsequently measured.

We claim:

1. A process for calibrating ion-current amplifiers in mass spectrometers possessing a plurality of ion-targets, especially Faraday targets, the individual measuring channels being calibrated by means of known reference-values, the measurement-values, obtained in this process, being stored, and the stored measurement-values being inter-correlated in order to form correction-factors for the individual measuring channels, characterized by the following steps: supplying an electric current having a high degree of constancy, as a reference-value, to the individual measuring channels in chronological succession; designating one of said channels as a reference channel; obtaining measurement-values, as a result of said electrical current, from each channel; and inter-correlating said measurement-values by division of all measurement-values by the measurement-value of said reference channel, the quotient of said division being said correction-factors whereby amplifier gain error in each of said channels is corrected.

2. A process according to claim 1, characterized in that two electric currents having a high degree of constancy, but differing from each other, are supplied to each measuring channel, in chronological succession, the measurement-values resulting from this procedure being subtracted, one from the other, and stored, whereupon these steps are repeated, in the same manner, for the other measuring channels.

3. A process according to claim 2, characterized in that one of the electric currents having a high degree of constancy has the value of zero.

4. A process according to one of claims 1 to 3, characterized in that, during the switching-over of another measuring channel and/or during switching between the two electric currents having a high degree of constancy, one output terminal of a source of voltages having a high degree of constancy is grounded, these voltages being used for generating the currents having a high degree of constancy.

5. A mass spectrometer with a plurality of ion-targets, especially Faraday targets, to each of which a separate measuring channel, with an amplifier, is series-connected, with an evaluating unit, and with a calibrating unit, characterized in that the calibrating unit contains a highly stable electrical voltage-source (6), the output of which can be connected, via switching devices ($K_1-K_3$, $K_5-K_n$), in each case to a common connection-point (8) of the individual ion-targets (1) and of the measuring channels ($V_1-V_m$) assigned thereto, in that a control device (7) is provided, which chronologically controls the switching devices ($K_1-K_2$, $K_4-K_n$), in such a manner that the voltage-source (6) is successively connected to the individual measuring channels ($V_1-V_m$) via a resistor (R2) having a high degree of constancy, and in that the outputs of all the measuring channels ($V_1-V_m$) are connected to a common calibrating-correction unit (5), which contains memory for the output measurement-values from all the measuring channels ($V_1-V_m$), as well as a processor which uses the stored values by taking a ratio of said stored-values with the stored-value of a predesignated reference channel in order to form a correction factor to correct amplifier gain error.

6. A mass spectrometer according to claim 5, characterized in that the highly stable voltage-source (6) can be switched over, by means of the control device (7), to at least two different voltage-values, it being possible to supply the currents generated from these voltages to each measuring channel ($V_1-V_m$) in chronological succession via the resistor (R2) having a high degree of constancy, and the output measurement-values, obtained from this procedure, being supplied to the storage, which is connected, on its output side, to a subtractor, in such a manner that the output measurement-values of each measuring channel are subtracted, one from the other.

7. A mass spectrometer according to claim 6, characterized in that one of the voltage-values of the highly stable electrical voltage-source (6) has the value of zero.

8. A mass spectrometer according to claim 6, characterized in that switching devices ($K_1-K_3$) are provided, which connect the output terminal of the highly stable voltage-source (6) to various tappings ($R_3$, $R_4$, +, Ground) of the voltage-source (6).

9. A mass spectrometer according to one of claim 5 characterized in that an additional switching device ($K_4$) is provided, which connects the switching devices ($K_5-K_n$), connecting the measuring channels ($V_1-V_m$) to the voltage-source (6), to that side of the voltage-source (6) which is at zero potential.

10. A mass spectrometer according to claim 9, characterized in that the additional switching device ($K_4$) can be actuated, by the control device (7), in such a manner that it is closed while one of the remaining switching devices ($K_1-K_3$, $K_5-K_n$) is being actuated.

11. A mass spectrometer according to one of claims 5 to 10, characterized in that the switching devices contain relays ($K_1-K_n$).

* * * * *